(12) United States Patent
Yamazaki

(10) Patent No.: US 12,217,994 B2
(45) Date of Patent: Feb. 4, 2025

(54) ELECTROSTATIC CHUCK DEVICE AND SLEEVE FOR ELECTROSTATIC CHUCK DEVICE

(71) Applicant: Tomoegawa Co., Ltd., Tokyo (JP)

(72) Inventor: Nobuyoshi Yamazaki, Shizuoka (JP)

(73) Assignee: TOMOEGAWA CORPORATION, Tokyo (JP)

( * ) Notice: Subject to any disclaimer, the term of this patent is extended or adjusted under 35 U.S.C. 154(b) by 184 days.

(21) Appl. No.: 17/911,440

(22) PCT Filed: Mar. 5, 2021

(86) PCT No.: PCT/JP2021/008815
§ 371 (c)(1),
(2) Date: Sep. 14, 2022

(87) PCT Pub. No.: WO2021/192935
PCT Pub. Date: Sep. 30, 2021

(65) Prior Publication Data
US 2023/0115256 A1    Apr. 13, 2023

(30) Foreign Application Priority Data
Mar. 26, 2020    (JP) .................................. 2020-055844

(51) Int. Cl.
*H01L 21/683* (2006.01)
*H01T 23/00* (2006.01)

(52) U.S. Cl.
CPC ................................ *H01L 21/6833* (2013.01)

(58) Field of Classification Search
CPC .................................................. H01L 21/6833
(Continued)

(56) References Cited

U.S. PATENT DOCUMENTS

2006/0175772 A1    8/2006  Nozawa
2013/0265690 A1*  10/2013  Maeta .................. H01L 21/6831
                                                              361/234
(Continued)

FOREIGN PATENT DOCUMENTS

JP    H10-233434 A    9/1998
JP    2004-127956 A   4/2004
(Continued)

OTHER PUBLICATIONS

Notification (information statement) issued Feb. 14, 2023 in JP Application No. 2022509496.
(Continued)

*Primary Examiner* — Jared Fureman
*Assistant Examiner* — Lucy M Thomas
(74) *Attorney, Agent, or Firm* — Panitch Schwarze Belisario & Nadel LLP

(57) ABSTRACT

An electrostatic chuck device containing a substrate, a stack stacked on an upper surface of the substrate in the thickness direction, and a ceramic layer stacked on an upper surface of the stack in the thickness direction. A sleeve formed from an insulating material is inserted into a through-hole that penetrates through the substrate and the stack in the thickness direction. The upper surface of the sleeve in the thickness direction has a two-level structure including a first upper surface positioned on the same plane as an upper surface of the substrate in the thickness direction, and a second upper surface positioned above the first upper surface in the thickness direction of the sleeve and disposed proximate to the ceramic layer. In a plan view, an edge portion of the stack is disposed on top of the first upper surface.

4 Claims, 7 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2014/0008880 A1* | 1/2014 | Miura | H01L 21/6831 |
| | | | 279/128 |
| 2018/0025933 A1* | 1/2018 | Ishimura | H01L 21/6833 |
| | | | 269/8 |
| 2019/0385883 A1 | 12/2019 | Yoshikawa et al. | |

FOREIGN PATENT DOCUMENTS

| | | | |
|---|---|---|---|
| JP | 2006344766 | A | 12/2006 |
| JP | 3128562 | U | 1/2007 |
| JP | 2016143744 | A | 8/2016 |
| JP | 2019-220503 | A | 12/2019 |
| TW | 200703545 | A | 1/2007 |
| TW | 201921485 | A | 6/2019 |
| WO | 2004/084298 | A1 | 9/2004 |
| WO | 2007/131057 | A2 | 11/2007 |

OTHER PUBLICATIONS

Int'l Search Report issued Jun. 8, 2021 in Int'l Application No. PCT/JP2021/008815.
Office Action issued Feb. 26, 2024 in TW Application No. 110108734 (English translation attached).
Office Action issued Feb. 6, 2023 in JP Application No. 2022509496.

* cited by examiner

ELECTROSTATIC CHUCK DEVICE AND SLEEVE FOR ELECTROSTATIC CHUCK DEVICE

CROSS-REFERENCE TO RELATED APPLICATIONS

This application is a Section 371 of International Application No. PCT/JP2021/008815, filed Mar. 5, 2021, which was published in the Japanese language on Sep. 30, 2021, under International Publication No. WO 2021/192935 A1, which claims priority under 35 U.S.C. § 119 (b) to Japanese Application No. 2020-055844, filed Mar. 26, 2020, the disclosure of each of which is incorporated herein by reference in its entirety.

TECHNICAL FIELD

The present invention relates to an electrostatic chuck device, and a sleeve for an electrostatic chuck device that may be used in the device.

Priority is claimed on Japanese Patent Application No. 2020-055844, filed Mar. 26, 2020, the content of which is incorporated herein by reference.

BACKGROUND ART

When producing a semiconductor integrated circuit using a semiconductor wafer, or when producing a liquid crystal panel using a glass substrate or an insulating substrate such as a film, the base material such as the semiconductor wafer, glass substrate or insulating substrate must be attached and held in a prescribed location. Consequently, in order to attach and hold these base materials, a mechanical chuck or vacuum chuck or the like that employs a mechanical method has typically been used. However, these holding methods have various problems, including difficulty in holding the base material (the attachment target body) uniformly, an inability to use these methods in a vacuum, and an overly large increase in the temperature of the sample surface. Accordingly, in recent years, electrostatic chuck devices which can address these problems have become widely used for holding attachment target bodies.

An electrostatic chuck device contains, as major components, a conductive support member that functions as an internal electrode, and a dielectric layer formed from a dielectric material that coats the conductive support member. These major components enable the attachment of an attachment target body. When a voltage is applied to the internal electrode inside the electrostatic chuck device, causing a potential difference to develop between the attachment target body and the conductive support member, an electrostatic attractive force is generated within the dielectric layer. This causes the attachment target body to be supported in a substantially flat manner on the conductive support member.

Electrostatic chuck devices in which an insulating organic film is stacked on the internal electrode to form the dielectric layer are already known. These types of electrostatic chuck devices are provided with a through-hole for cooling the held semiconductor wafer with a gas (for example, see Patent Document 1).

In these types of electrostatic chuck devices, a structure may be used which contains, for example, a substrate, a stack containing an internal electrode which is stacked on top of the substrate, a ceramic layer which is stacked on the upper surface of the stack in the thickness direction, an insulating sleeve which is inserted in a through-hole formed for the purpose of cooling the semiconductor wafer with a gas, and a filler layer that is provided between the stack and the insulating sleeve.

PRIOR ART LITERATURE

Patent Document

Patent Document 1: International Patent Publication No. WO 2004/084298

SUMMARY OF INVENTION

Problems to be Solved by the Invention

In the electrostatic chuck device described above, the interfaces between a plurality of materials having different coefficients of linear expansion are concentrated in the vicinity of the stack and the insulating sleeve, and when the material of the ceramic layer is thermally sprayed onto the stack, the filler layer undergoes thermal expansion, concentrating the stress at a single point, which can sometimes cause cracking of the ceramic layer.

The present invention has been developed in light of the above circumstances, and has an object of providing an electrostatic chuck device for which cracking of the ceramic layer is suppressed, and a sleeve for an electrostatic chuck device that may be used therein.

Means for Solving the Problems

The present invention includes the following aspects.
[1] An electrostatic chuck device containing a substrate, a stack containing at least an internal electrode stacked on top of the substrate, and a ceramic layer stacked on the upper surface of the stack in the thickness direction, wherein a through-hole is provided which penetrates through the substrate and the stack in the thickness direction, a sleeve formed from an insulating material is inserted in the through-hole, the upper surface of the sleeve in the thickness direction has a two-level structure having a first upper surface positioned on the same plane as the upper surface of the substrate in the thickness direction, and a second upper surface positioned above the first upper surface in the thickness direction of the sleeve and disposed proximate to the ceramic layer, and in a plan view, the edge portion of the stack is disposed on top of the first upper surface.
[2] The electrostatic chuck device according to [1], wherein the ceramic layer has a base layer, and a surface layer having unevenness formed on the upper surface of the base layer.
[3] A sleeve for use in an electrostatic chuck device, wherein the upper surface of the sleeve in the thickness direction has a first upper surface, and a second upper surface positioned above the first upper surface in the thickness direction of the sleeve.

Effects of the Invention

By using the present invention, an electrostatic chuck device can be provided which suppresses cracking of the ceramic layer as a result of dispersion of the stress produced when the heat that is generated during formation of the ceramic layer causes thermal expansion of the filler used to fill the space between the end surface of the stack containing at least the internal electrode and an insulating organic film and the outside surface of the sleeve, and a sleeve for use in this electrostatic chuck device can also be provided.

EMBODIMENTS FOR CARRYING OUT THE INVENTION

Figure 1:
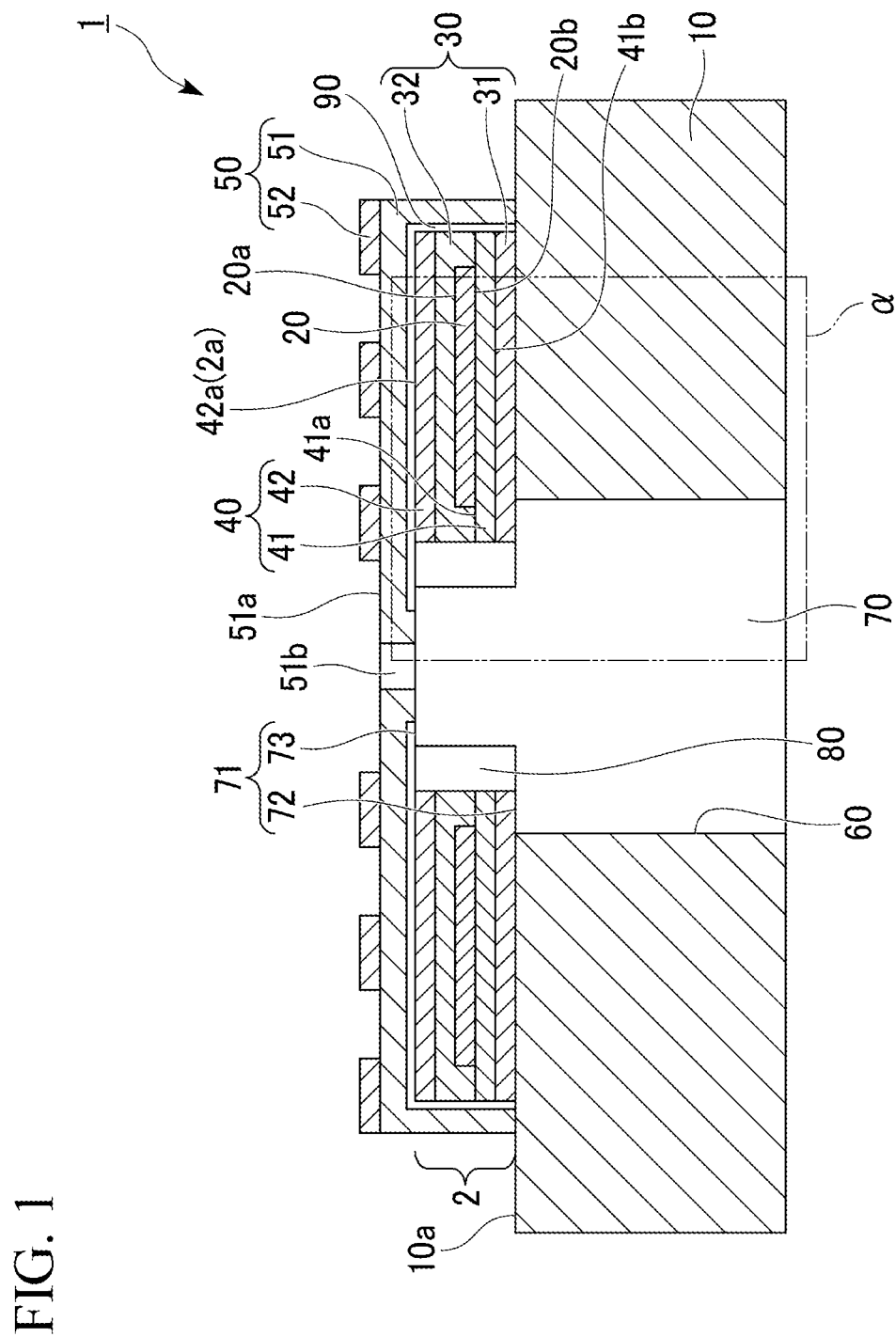
FIG. 1 is a cross-sectional view illustrating the basic structure of an electrostatic chuck device according to the present invention, viewed along the height direction of the electrostatic chuck device.

Electrostatic chuck devices of embodiments applying the present invention are described below. In the drawings used in the following descriptions, the dimensional ratios and the like between the various structural components need not necessarily be the same as the actual values. These embodiments are merely examples that have been described in detail for the purpose of facilitating comprehension of the features of the present invention, and unless specifically stated otherwise, do not restrict the scope of the present invention.
[Electrostatic Chuck Device]

First Embodiment

Figure 2:
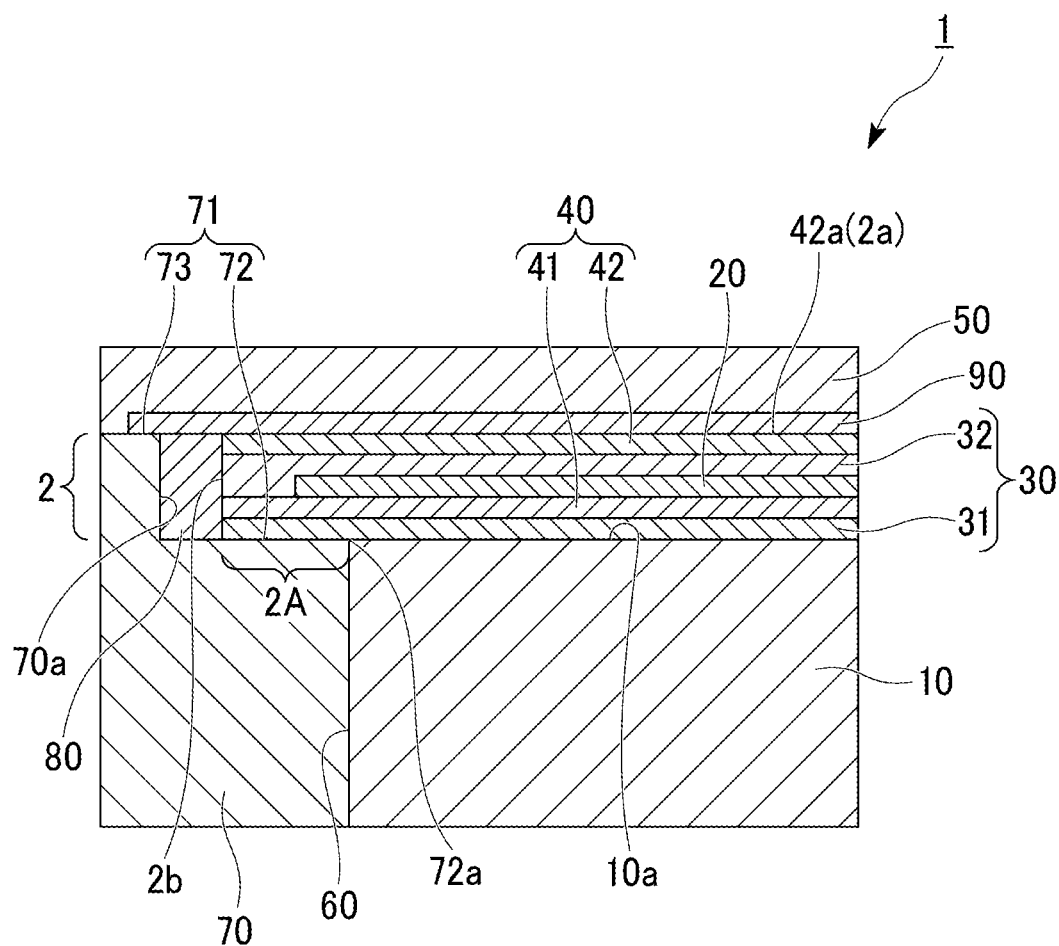
FIG. 2 is a diagram illustrating the basic structure of an electrostatic chuck device according to the present invention, and represents an enlargement of the region a shown in FIG. 1.

FIG. 1 is a cross-sectional view illustrating the basic structure of an electrostatic chuck device according to this embodiment, viewed along the height direction of the electrostatic chuck device. FIG. 2 is a diagram illustrating a first embodiment of the basic structure of an electrostatic chuck device according to the present invention, and represents an enlargement of the region a shown in FIG. 1.

As illustrated in FIG. 1, the electrostatic chuck device 1 of this embodiment contains a substrate 10, a stack 2 containing at least a plurality of internal electrodes 20, and a ceramic layer 50 stacked on an upper surface 2a of the stack 2 in the thickness direction.

In the electrostatic chuck device 1 of this embodiment, the stack 2 may also include, besides the internal electrodes 20, adhesive layers 30 and insulating organic films 40. The adhesive layers 30 include a first adhesive layer 31 and a second adhesive layer 32. The insulating organic films 40 include a first insulating organic film 41 and a second insulating organic film 42.

In the electrostatic chuck device 1 of this embodiment, the first adhesive layer 31, the first insulating organic film 41, the internal electrode 20, the second adhesive layer 32, the second insulating organic film 42, an intermediate layer 90, and the ceramic layer 50 are stacked in that sequence on a surface 10a of the substrate 10 (namely, the upper surface 10a of the substrate 10 in the thickness direction).

In the electrostatic chuck device 1 of this embodiment, the structure containing the internal electrode 20, the first adhesive layer 31, the second adhesive layer 32, the first insulating organic film 41 and the second insulating organic film 42 is termed the stack 2.

As illustrated in FIG. 1, in the electrostatic chuck device 1 of this embodiment, the stack 2 may include at least the insulating organic films 40 provided on both surfaces of the internal electrode 20 in the thickness direction (namely, an upper surface 20a of the internal electrode 20 in the thickness direction, and a lower surface 20b of the internal electrode 20 in the thickness direction). More specifically, the second insulating organic film 42 may be provided on the upper surface 20a of the internal electrode 20 in the thickness direction, and the first insulating organic film 41 may be provided on the lower surface 20b of the internal electrode 20 in the thickness direction.

The first adhesive layer 31 is provided on the surface of the first insulating organic film 41 on the opposite side from the internal electrode 20 (a lower surface 41b of the first insulating organic film 41). The second adhesive layer 32 is provided between the first insulating organic film 41 and the internal electrode 20 provided on an upper surface 41a of the first insulating organic film 41 in the thickness direction, and the second insulating organic film 42.

In the electrostatic chuck device 1 of this embodiment, a through-hole 60 is provided that penetrates through the thickness direction of the substrate 10 and the stack 2. A sleeve 70 formed from an insulating material is inserted into the through-hole 60.

The through-hole 60 is a hole that is used for cooling the ceramic layer 50 with a gas, and for the insertion of a lift pin or the like to lift up the attachment target body attached to the electrostatic chuck device 1.

An upper surface 71 of the sleeve 70 in the thickness direction has a two-level structure having a first upper surface 72 positioned on the same plane as the upper surface 10a of the substrate 10 in the thickness direction, and a second upper surface 73 positioned above the first upper surface 72 in the thickness direction of the sleeve 70 and disposed proximate to the ceramic layer 50. In other words, the first upper surface 72 of the sleeve 70 is of the same height as the upper surface 10a of the substrate 10 in the thickness direction of the substrate 10.

As illustrated in FIG. 2, in a plan view of the electrostatic chuck device 1, an edge portion 2A of the stack 2 is disposed on top of the first upper surface 72 of the sleeve 70. The allowable range for the length in the horizontal direction of the edge portion 2A disposed on the first upper surface 72 of the sleeve 70 is not particularly limited, but based on the outside edge 72a of the first upper surface 72, is preferably within a range from 10% to 90%, and more preferably from 30% to 70%, of the length from an outside surface 70a between the first upper surface 72 and the second upper surface 73 to the outside edge 72a of the first upper surface 72.

The space between the end surface 2b of the stack 2 (the outside surface of the edge portion 2A) and the outside surface 70a of the sleeve 70 (the outside surface 70a between the first upper surface 72 and the second upper surface 73) may be filled with a filler 80, or may be left as a void.

As illustrated in FIG. 1, the ceramic layer 50 preferably has a ceramic base layer 51, and a ceramic surface layer 52 having unevenness that is formed on an upper surface 51a of the ceramic base layer 51 (the upper surface 51a of the ceramic base layer 51 in the thickness direction). Further, a through-hole 51b is provided in, and penetrates through the thickness direction of, the ceramic base layer 51. The internal diameter of the through-hole 51b (the diameter perpendicular to the thickness direction of the ceramic base layer 51) is smaller than the internal diameter of the through-hole 60 (the diameter perpendicular to the thickness direction of the substrate 10 and the stack 2).

The internal electrode 20 may contact the first insulating organic film 41 or the second insulating organic film 42. As illustrated in FIG. 1, the internal electrode 20 may be formed within the interior of the second adhesive layer 32. The positioning of the internal electrode 20 may be designed as is appropriate.

When the plurality of internal electrodes 20 are mutually independent as illustrated in FIG. 1, not only can a voltage of the same polarity be applied to the internal electrodes 20, but voltages of differing polarity may also be applied. Provided the internal electrodes 20 are capable of attracting attachment target bodies such as conductors, semiconductors and insulators, there are no particular limitations on the electrode pattern or shape. Further, the internal electrodes 20 need not necessarily be independent.

In FIG. 1, the electrostatic chuck device 1 of this embodiment has the substrate 10, the stack 2 containing at least the internal electrode 20 stacked on top of the sleeve 70, and the ceramic layer 50 then stacked on the upper surface 2a of the stack 2, but the substrate 10 may be excluded.

There are no particular limitations on the substrate 10, and example include ceramic substrates, silicon carbide substrates, and metal substrates formed from aluminum or stainless steel or the like.

There are no particular limitations on the internal electrodes 20, provided they are formed from a conductive substance that can generate an electrostatic attractive force when a voltage is applied. Examples of materials that can be used favorably as the internal electrode 20 include thin films formed from metals such as copper, aluminum, gold, silver, platinum, chromium, nickel and tungsten, and thin films formed from at least two metals selected from among the above metals. Examples of these types of metal thin films include films deposited by vapor deposition, plating or sputtering or the like, and films formed by application and drying of a conductive paste, and specific examples include metal foils such as copper foil.

Provided the thickness of the second adhesive layer 32 is greater than the thickness of the internal electrode 20, there are no particular limitations on the thickness of the internal electrode 20. The thickness of the internal electrode 20 is preferably not more than 20 μm. Provided the thickness of the internal electrode 20 is 20 μm or less, during formation of the second insulating organic film 42, unevenness is unlikely to develop in the upper surface 42a of the second insulating organic film 42. As a result, problems are less likely to arise when the ceramic layer 50 is formed on top of the second insulating organic film 42, and when the ceramic layer 50 is polished.

The thickness of the internal electrode 20 is preferably at least 1 μm. Provided the thickness of the internal electrode 20 is at least 1 μn, sufficient bonding strength can be achieved when bonding the internal electrode 20 and the first insulating organic film 41 or second insulating organic film 42.

In those cases where a voltage of different polarity is applied to each of the plurality of internal electrodes 20, the spacing between adjacent internal electrodes 20 (the spacing in a direction perpendicular to the thickness direction of the internal electrodes 20) is preferably not more than 2 mm. Provided the spacing between adjacent internal electrodes 20 is 2 mm or less, a satisfactory electrostatic force is generated between the adjacent internal electrodes 20, meaning a satisfactory attractive force can be achieved.

The distance from the internal electrodes 20 to the attachment target body, namely the distance from the upper surface 20a of the internal electrode 20 to the attachment target body attached to the ceramic surface layer 52 (namely, the combined thickness of the second adhesive layer 32, the second insulating organic film 42, the ceramic base layer 51 and the ceramic surface layer 52 that are disposed on the upper surface 20a of the internal electrode 20) is preferably within a range from 50 μm to 125 μm. Provided this distance from the internal electrodes 20 to the attachment target body is at least 50 μm, the insulating properties of the stack composed of the second adhesive layer 32, the second insulating organic film 42, the ceramic base layer 51 and the ceramic surface layer 52 can be ensured. On the other hand, provided distance from the internal electrodes 20 to the attachment target body is not more than 125 μm, a satisfactory attractive force can be generated.

Examples of adhesives that may be used as the adhesive that constitutes the adhesive layers 30 include adhesives containing, as the main component, one resin, or two or more resins, selected from among epoxy resins, phenol resins, styrene-based block copolymers, polyamide resins, acrylonitrile-butadiene copolymers, polyester resins, polyimide resins, silicone resins, amine compounds, and bismaleimide compounds and the like.

Examples of the epoxy resins include difunctional or polyfunctional epoxy resins such as bisphenol epoxy resins, phenol novolac epoxy resins, cresol novolac epoxy resins, glycidyl ether epoxy resins, glycidyl ester epoxy resins, glycidyl amine epoxy resins, trihydroxyphenylmethane epoxy resins, tetraglycidylphenol alkane epoxy resins, naphthalene epoxy resins, diglycidyldiphenylmethane epoxy resins, and diglycidylbiphenyl epoxy resins. Among these resins, bisphenol epoxy resins are preferred. Among bisphenol epoxy resins, bisphenol A epoxy resins are particularly preferred. Further, when an epoxy resin is used as the main component, an epoxy resin curing agent or curing accelerator such as an imidazole, tertiary amine phenol, dicyandiamide, aromatic diamine or organic peroxide may also be added as necessary.

Examples of the phenol resins include alkylphenol resins, p-phenylphenol resins, novolac phenol resins such as bisphenol A phenol resins, resol phenol resins, and polyphenyl para-phenol resins.

Examples of the styrene-based block copolymers include styrene-butadiene-styrene block copolymers (SBS), styrene-isoprene-styrene block copolymers (SIS), and styrene-ethylene-propylene-styrene copolymers (SEPS) and the like.

There are no particular limitations on the thicknesses of the adhesive layers 30 (the first adhesive layers 31 and the second adhesive layer 32), but the thickness is preferably within a range from 5 μm to 20 μm, and more preferably from 10 µm to 20 µm. Provided the thickness of the adhesive layers 30 (the first adhesive layer 31 and the second adhesive layer 32) is at least 5 µm, the layer functions satisfactorily as an adhesive. On the other hand, provided the thickness of the adhesive layers 30 (the first adhesive layer 31 and the second adhesive layer 32) is not more than 20 µm, insulation between the electrodes of the internal electrodes 20 can be ensured without impairing the attractive force.

There are no particular limitations on the material that constitutes the insulating organic films 40, and examples include polyesters such as polyethylene terephthalate, polyolefins such as polyethylene, polyimides, polyamides, polyamideimides, polyethersulfones, polyphenylene sulfides, polyetherketones, polyetherimides, triacetyl cellulose, silicone rubbers, and polytetrafluoroethylene. Among these, in terms of providing excellent insulating properties, polyesters, polyolefins, polyimides, silicone rubbers, polyetherimides, polyethersulfones and polytetrafluoroethylene are preferred, and polyimides are particularly preferred. Examples of polyimide films include Kapton (a brand name) manufactured by DuPont Toray Co., Ltd., and UPILEX (a brand name) manufactured by UBE Corporation.

There are no particular limitations on the thicknesses of the insulating organic films 40 (the first insulating organic film 41 and the second insulating organic film 42), but the thickness is preferably within a range from 10 µm to 100 µm, and more preferably from 10 µm to 50 µm. Provided the thickness of the insulating organic films 40 (the first insulating organic film 41 and the second insulating organic film 42) is at least 10 µm, satisfactory insulating properties can be ensured. On the other hand, provided the thickness of the insulating organic films 40 (the first insulating organic film 41 and the second insulating organic film 42) is not more than 100 µm, a satisfactory attractive force is generated.

Furthermore, a ceramic plate formed from a ceramic material may be used instead of the insulating organic film 40 (the first insulating organic film 41 and the second insulating organic film 42).

The through-hole 60 penetrates through the substrate 10 and the stack 2 in the thickness direction, but there are no particular limitations on the shape of the through-hole when viewed in plan view (namely, the shape when viewed from the side of the upper surface 51*a* of the ceramic base layer 51). Examples of the plan view shape of the through-hole 60 include a circular shape or a rectangular shape. Although there are no particular limitations on the internal diameter of the through-hole 60, the internal diameter is, for example, preferably within a range from 5 mm to 15 mm, and more preferably from 5 mm to 13 mm. The internal diameter of the through-hole 60 refers to the diameter of the through-hole 60 in those cases where the plan view shape of the through-hole 60 is a circular shape, and refers to the length across the widest portion of the through-hole 60 in those cases where the plan view shape of the through-hole 60 is a shape other than a circular shape.

Examples of the insulating material that constitutes the sleeve 70 include aluminum oxide (alumina), yttrium oxide (yttria), zirconium oxide (zirconia), and resins and the like.

Figure 6:
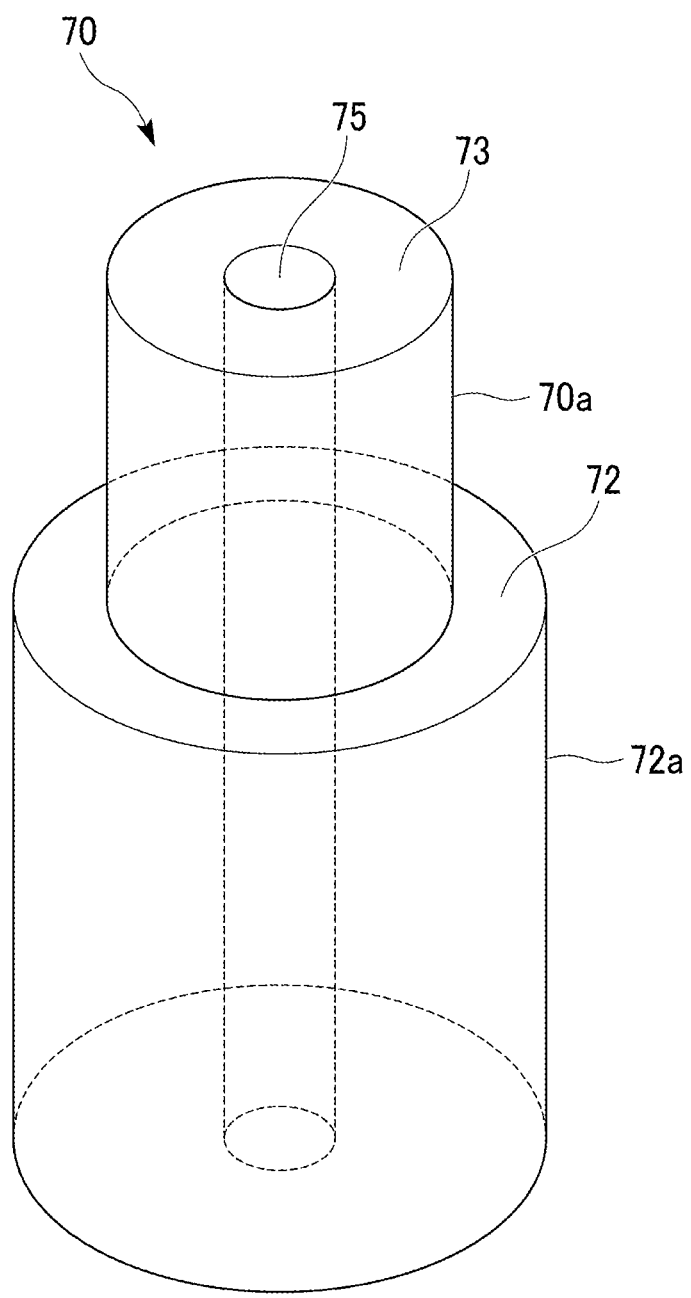
FIG. 6 is a perspective view illustrating the basic structure of a sleeve for an electrostatic chuck device according to the present invention.

As illustrated in FIG. 6, the sleeve 70 is a column-like member, having the first upper surface 72 and the second upper surface 73, which is positioned above the first upper surface 72 in the thickness direction of the sleeve 70, located at the upper surface of the sleeve in the thickness direction. The sleeve 70 has a through-hole 75 located near the central portion of the column-like structure. The through-hole 75 is used for cooling the ceramic layer 50 with a gas, and for the insertion of a lift pin or the like to lift up the attachment target body attached to the electrostatic chuck device 1. There are no particular limitations on the shape of the sleeve 70 in a cross-section perpendicular to the lengthwise direction of the sleeve, and this shape may be set appropriately in accordance with the plan view shape of the through-hole 60 described above.

Although there are no particular limitations on the diameter of the through-hole 75 in the sleeve 70, the diameter is, for example, preferably within a range from 0.5 mm to 5 mm, and more preferably from 0.3 mm to 3 mm.

The sleeve 70 can be produced by molding the insulating material described above in a mold, or by cutting a column-shaped insulating material.

There are no particular limitations on the external diameter of the sleeve 70 below the first upper surface 72 (in the thickness direction of the sleeve 70), but this external diameter is, for example, preferably within a range from 4 mm to 15 mm, and more preferably from 4 mm to 10 mm. There are no particular limitations on the external diameter of the sleeve 70 above the first upper surface 72 (in the in the thickness direction of the sleeve 70), but this external diameter is, for example, preferably within a range from 1 mm to 7 min, and more preferably from 2 mm to 4 mm. The external diameter of the sleeve 70 refers to the diameter of the cross-section of the sleeve 70 perpendicular to the lengthwise direction of the sleeve in those cases where the cross-sectional shape of the sleeve 70 in a direction perpendicular to the lengthwise direction is a circular shape, and refers to the length across the widest portion of the cross-section of the sleeve 70 perpendicular to the lengthwise direction of the sleeve in those cases where the cross-sectional shape of the sleeve 70 in a direction perpendicular to the lengthwise direction is a shape other than a circular shape.

There are no particular limitations on the size of the first upper surface 72 of the sleeve 70, but for example, the length from the outside surface 70*a* between the first upper surface 71 and the second upper surface 72 to the outside edge 72*a* of the first upper surface 72 is preferably within a range from 1 mm to 5 mm, and more preferably from 1 mm to 3 mm.

An adhesive is used as the filler 80.

There are no particular limitations on the adhesive, and examples include epoxy resins, polyimide-based resins, acrylic-based resins, silane-based resins, and silicone resins.

There are no particular limitations on the material that constitutes the ceramic layer 50, and examples of materials that may be used include boron nitride, aluminum nitride, aluminum oxide (alumina), zirconium oxide, silicon oxide, tin oxide, indium oxide, quartz glass, soda glass, lead glass, borosilicate glass, zirconium nitride and titanium oxide, and aluminum oxide can be used particularly favorably. One of these materials may be used alone, or a mixture of two or more materials may be used.

These materials are preferably powders with an average particle size of 1 µm to 25 µm. By using this type of powder, voids within the ceramic layer 50 can be reduced, and the withstand voltage of the ceramic layer 50 can be increased.

The thickness of the ceramic base layer 51 is preferably within a range from 10 µm to 80 µm, and more preferably from 40 µm to 60 µm. Provided the thickness of the ceramic base layer 51 is at least 10 µm, the layer exhibits satisfactory plasma resistance and withstand voltage properties. On the other hand, provided the thickness of the ceramic base layer 51 is not more than 80 µm, a satisfactory attractive force is generated.

The thickness of the ceramic surface layer 52 is preferably within a range from 5 µm to 20 µm. Provided the thickness of the ceramic surface layer 52 is at least 5 µm, unevenness can be formed across the entire ceramic surface layer 52. On the other hand, provided the thickness of the ceramic surface layer 52 is not more than 20 µm, a satisfactory attractive force is generated.

The attractive force of the ceramic surface layer 52 can be increased by polishing the surface of the ceramic surface layer 52, and the unevenness of that surface can be adjusted as a surface roughness Ra.

Here, the surface roughness Ra means a value measured in accordance with the method prescribed in JIS B0601-1994.

The surface roughness Ra of the ceramic surface layer 52 is preferably within a range from 0.05 µm to 0.5 µm. Provided the surface roughness Ra of the ceramic surface layer 52 falls within the above range, the attachment target body can be favorably attached. As the surface roughness Ra of the ceramic surface layer 52 increases, the contact surface area between the attachment target body and the ceramic surface layer 52 decreases, and therefore the attractive force also decreases.

As illustrated in FIG. 1, in the electrostatic chuck device 1 of this embodiment, the ceramic layer 50 may be stacked on the upper surface 2a in the thickness direction of the stack 2 containing at least the internal electrode 20 (namely, the upper surface 42a of the second insulating organic film 42) with an intermediate layer 90 disposed therebetween.

The intermediate layer 90 preferably contains at least one of an organic insulating resin and an inorganic insulating resin, and at least one of an inorganic filler and a fibrous filler.

There are no particular limitations on the organic insulating resin, and examples include polyimide-based resins, epoxy-based resins, and acrylic-based resins.

There are no particular limitations on the inorganic insulating resin, and examples include silane-based resins and silicone-based resins.

The intermediate layer 90 preferably contains a polysilazane. Examples of the polysilazane include conventional materials used within this field. The polysilazane may be an organic polysilazane or an inorganic polysilazane. One of these materials may be used alone, or a mixture of two or more materials may be used.

The amount of inorganic filler within the intermediate layer 90 per 100 parts by mass of the polysilazane is preferably within a range from 100 parts by mass to 300 parts by mass, and more preferably from 150 parts by mass to 250 parts by mass. Provided the amount of inorganic filler within the intermediate layer 90 falls within this range, particles of the inorganic filler can form unevenness on the surface of the resin film that represents the cured product of the intermediate layer 90, and therefore the powder of the thermal spray material can more readily penetrate into spaces between the inorganic filler particles, enabling the thermal spray material to bond more powerfully to the resin film surface.

Although there are no particular limitations on the inorganic filler, at least one material selected from the group consisting of alumina, silica and yttria is preferred, and alumina is particularly preferred.

The inorganic filler is preferably at least one of a spherical powder and an amorphous powder. A spherical powder refers to a powder in which the particles have a spherical shape with rounded corners. Further, an amorphous powder refers to a powder that does not adopt a regular form, such as a crushed powder, plate-like powder, scale-like powder or needle-like powder.

The average particle size of the inorganic filler is preferably within a range from 1 µm to 20 µm. In those cases where the inorganic filler is a spherical powder, the diameter (external diameter) of the powder particles is used as the particle size, whereas when the inorganic filler is an amorphous powder, the length of the longest dimension of the powder shape is used as the particle size.

The fibrous filler is preferably at least one type of material selected from the group consisting of plant fibers, inorganic fibers and fiberized organic resins.

Examples of the plant fibers include pulps and the like.

Examples of the inorganic fibers include fibers composed of alumina and the like.

Examples of the fiberized organic resins include fibers formed from aramid or Teflon (a registered trademark) or the like.

The inorganic filler is preferably used in combination with a fibrous filler, and the total amount of the inorganic filler and the fibrous filler relative to the entire intermediate layer 90 (100% by volume) is preferably within a range from 10% by volume to 80% by volume. Provided the total amount of the inorganic filler and the fibrous filler in the intermediate layer 90 falls within this range, thermal spraying can be used to form a ceramic layer uniformly on top of the intermediate layer 90.

The thickness of the intermediate layer 90 is preferably within a range from 1 µm to 40 µm, and more preferably from 5 µm to 20 µm. Provided the thickness of the intermediate layer 90 is at least 1 µm, localized thinning of the intermediate layer 90 is avoided, and the ceramic layer 50 can be formed uniformly on top of the intermediate layer 90 by thermal spraying. On the other hand, provided the thickness of the intermediate layer 90 is not more than 40 µm, a satisfactory attractive force is generated.

In the electrostatic chuck device 1 of the embodiment described above, the through-hole 60 is provided so as to penetrate through the substrate 10 and the stack 2 in the thickness direction, the sleeve 70 is inserted inside the through-hole 60, the upper surface 71 of the sleeve 70 in the thickness direction has a two-level structure having the first upper surface 72 positioned on the same plane as the upper surface 10a of the substrate 10 in the thickness direction, and the second upper surface 73 positioned above the first upper surface 72 in the thickness direction of the sleeve 70 and disposed proximate to the ceramic layer 50, and when viewed in plan view, the edge portion 2A of the stack 2 is disposed on top of the first upper surface 72. Accordingly, the stress that develops when the heat that is generated during formation of the ceramic layer 50 causes thermal expansion of the filler 80 used to fill the space between the end surface 2b of the stack 2 and the outside surface 70a of the sleeve 70 can be dispersed, and cracking of the ceramic layer 50 (and particularly the ceramic base layer 51) caused by that stress can be suppressed.

In the electrostatic chuck device 1 of this embodiment, because the ceramic layer 50 has the ceramic base layer 51 and the ceramic surface layer 52 having unevenness formed on the upper surface 51a of the ceramic base layer 51 the attractive force can be controlled at the desired level.

In the electrostatic chuck device 1 of this embodiment, when the insulating organic films are polyimide films, the withstand voltage can be further increased.

[Method for Producing Electrostatic Chuck]

A method for producing the electrostatic chuck device 1 of the above embodiment is described below with reference to FIG. 1.

A metal such as copper is deposited on the surface 41a of the first insulating organic film 41 (namely, the upper surface of the first insulating organic film 41 in the thickness direction) by vapor deposition, thus forming a metal thin film. Subsequently, etching is conducted to pattern the metal thin film into a prescribed shape, thus forming the internal electrode 20.

Next, the second insulating organic film 42 is bonded to the upper surface 20a of the internal electrode 20 via the second adhesive layer 32.

Subsequently, the first adhesive layer 31 is formed on the surface of the first insulating organic film 41 on the opposite side from the surface on which the internal electrodes 20 have been formed, thus obtaining the stack 2 having the first adhesive layer 31, the first insulating organic film 41, the internal electrode 20, the second adhesive layer 32 and the second insulating organic film 42 stacked in that order.

Then, a laser light is irradiated from the surface of the stack 2 (the surface of the second insulating organic film 42) to form a hole in the stack corresponding with the through-hole 60 in the substrate 10.

Meanwhile, the through-hole 60 is formed in the substrate 10 using a drill or the like, and the sleeve 70 with the two-level structure described above composed of the first upper surface 72 and the second upper surface 73 is then bonded inside the through-hole 60.

Subsequently, the stack 2 having the hole formed therein is bonded to the surface 10a of the substrate 10 and the first upper surface 72 of the sleeve 70 via the first adhesive layer 31.

Then, the intermediate layer 90 is formed on the entire outside surface of the stack 2 stacked on top of the surface 10a of the substrate 10 and the first upper surface 72 of the sleeve 70, and on the second upper surface 73 of the sleeve 70, and the ceramic base layer 51 is then formed so as to cover the entire outer surface of the intermediate layer 90.

Examples of the method used for forming the ceramic base layer 51 include a method in which a slurry containing the material that constitutes the ceramic base layer 51 is applied uniformly across the entire outer surface of the intermediate layer 90 and is then sintered to form the ceramic base layer 51, and a method in which the material that constitutes the ceramic base layer 51 is thermally sprayed across the entire outer surface of the intermediate layer 90 to form the ceramic base layer 51.

Here, the term "thermal spraying" refers to a method in which a material that forms a film (in this embodiment, the ceramic base layer 51) is melted by heating, and is then jetted onto a processing target body using a compressed gas, thus forming a film.

Subsequently, the ceramic surface layer 52 is formed on the upper surface 51a of the ceramic base layer 51.

Examples of the method used for forming the ceramic surface layer 52 include a method in which the upper surface 51a of the ceramic base layer 51 is subjected to masking of a prescribed shape, and the material that constitutes the ceramic surface layer 52 is then thermally sprayed onto upper surface 51a of the ceramic base layer 51 to form the ceramic surface layer 52, and a method in which the material that constitutes the ceramic surface layer 52 is thermally sprayed across the entire upper surface 51a of the ceramic base layer 51 to form the ceramic surface layer 52, and that ceramic surface layer 52 is then etched by a blast treatment to form an uneven shape on the ceramic surface layer 52.

By employing the steps described above, the electrostatic chuck device 1 of this embodiment can be produced.

EXAMPLES

The present invention is described below in further detail using a series of examples and comparative examples, but the present invention is in no way limited by the following examples.

Example 1

For the first insulating organic film 41, a copper film with a thickness of 9 μm was plated onto one surface of a polyimide film with a film thickness of 12.5 μm (brand name: Kapton, manufactured by DuPont Toray Co., Ltd.). Following application of a photoresist to the copper foil surface, a pattern exposure and then a development process were conducted, and the unnecessary copper foil was removed by etching. Subsequently, the copper foil on the polyimide film was washed to remove the photoresist, thus completing formation of the internal electrodes 20. An insulating adhesive sheet that had been semi-cured by drying and heating was stacked on top of the internal electrodes 20 as the second adhesive layer 32. The insulating adhesive sheet that was used was prepared by mixing and dissolving 27 parts by mass of a bismaleimide resin, 3 parts by mass of diaminosiloxane, 20 parts by mass of a resol phenol resin, 10 parts by mass of a biphenyl epoxy resin and 240 parts by mass of an ethyl acrylate-butyl acrylate-acrylonitrile copolymer in a suitable amount of tetrahydrofuran, and then molding the mixture into a sheet-like form. Subsequently, a polyimide film with a film thickness of 12.5 μm (brand name: Kapton, manufactured by DuPont Toray Co., Ltd.) was bonded as the second insulating organic film 42, and a heat treatment was then conducted to obtain the bonded stack 2. The thickness of the second adhesive layer 32 following drying was 20 μm.

Moreover, a sheet of an insulating adhesive of the same composition as the semi-cured insulating adhesive sheet described above was stacked, as the first adhesive layer 31, on the surface of the first insulating organic film 41 in the above stack on the opposite side from the surface on which the internal electrodes 20 had been formed, and a laser light was used to form a hole corresponding with the through-hole 60 in the substrate 10.

Meanwhile, the through-hole 60 was formed in the substrate 10 using a drill or the like, and the sleeve 70 formed from alumina ($Al_2O_3$) and having a two-level structure composed of the first upper surface 72 and the second upper surface 73 was then bonded inside the through-hole 60. Subsequently, the stack 2 was affixed to the aluminum substrate 10 and bonded by conducting a heat treatment. The thickness of the first adhesive layer 31 following drying was 10 μm.

Next, 100 parts by mass of a polysilazane and 200 parts by mass of an inorganic filler composed of alumina (average particle size: 3 μm) were mixed with butyl acetate as a dilution medium, and an ultrasonic dispersion device was then used to disperse the inorganic filler uniformly and complete preparation of a coating material.

Subsequently, the above coating material was sprayed onto the surface of the second insulating organic film 42 of the stack bonded to the substrate 10 and then dried under heat to form the intermediate layer 90. The thickness of the intermediate layer 90 following drying on the surface of the second insulating organic film 42 was 10 μm.

Next, an alumina (Al₂O₃) powder (average particle size: 8 μm) was thermally sprayed onto the intermediate layer 50 using a plasma spraying method, thereby forming the ceramic base layer 51 with a thickness of 50 μm.

Subsequently, the surface of the ceramic base layer 51 was masked with a prescribed shape, and the alumina (Al₂O₃) powder (average particle size: 8 μm) described above was then thermally sprayed onto the surface of the ceramic base layer 51, thus forming the ceramic surface layer 52 with a thickness of 15 μm.

Figure 3:
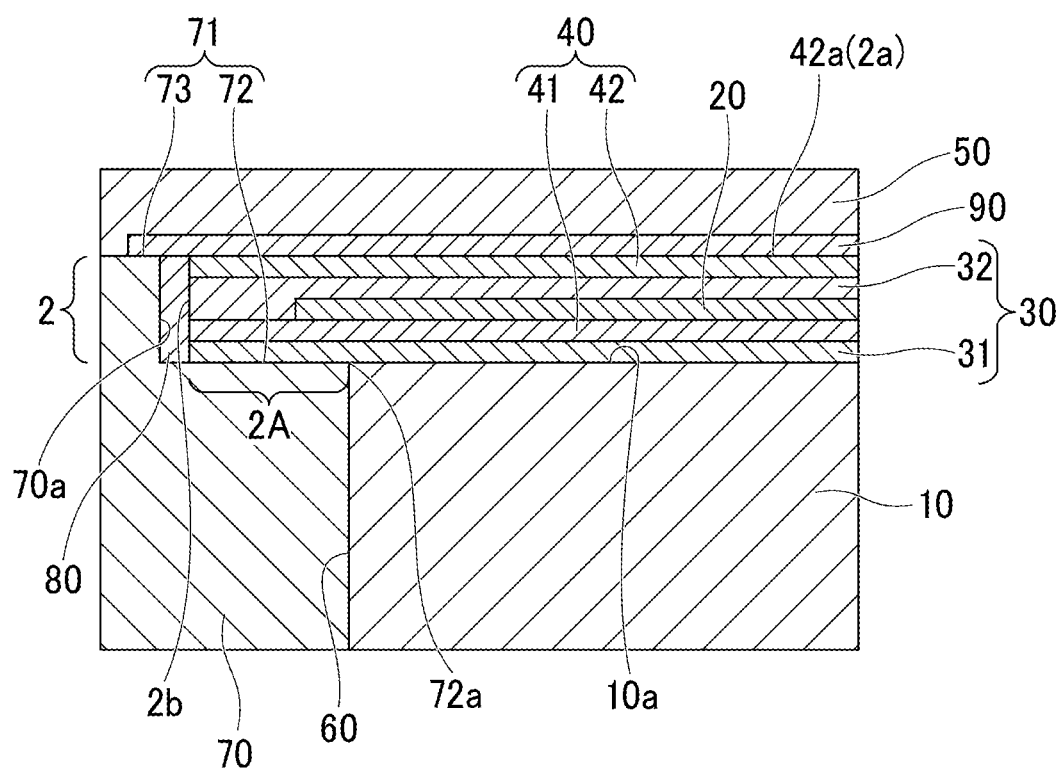
FIG. 3 is a diagram illustrating the basic structure of an electrostatic chuck device of Example 1, and represents an enlargement of the region corresponding with the region a shown in FIG. 1.

Next, the attachment surface of the ceramic surface layer 52 to which the attachment target body is attached was subjected to surface grinding with a diamond grinding wheel, thus obtaining an electrostatic chuck device of Example 1 illustrated in FIG. 3. In FIG. 3, the unevenness on the outer surface of the ceramic layer 50 formed by the ceramic surface layer 52 is omitted.

In the obtained electrostatic chuck device, the edge portion 2A of the stack 2 was disposed on the first upper surface 72 of the sleeve 70, and the length in the horizontal direction of the edge portion 2A on the first upper surface 72, based on the outside edge 72a of the first upper surface 72, was 75% of the length from the outside surface 70a between the first upper surface 72 and the second upper surface 73 to the outside edge 72a of the first upper surface 72.

In the obtained electrostatic chuck device, the presence or absence of cracking in the ceramic layer 50 was confirmed visually. When no cracking had occurred, an evaluation of "o" was recorded, whereas when cracking had occurred, and evaluation of "x" was recorded. The result is shown in Table 1.

Example 2

Figure 4:
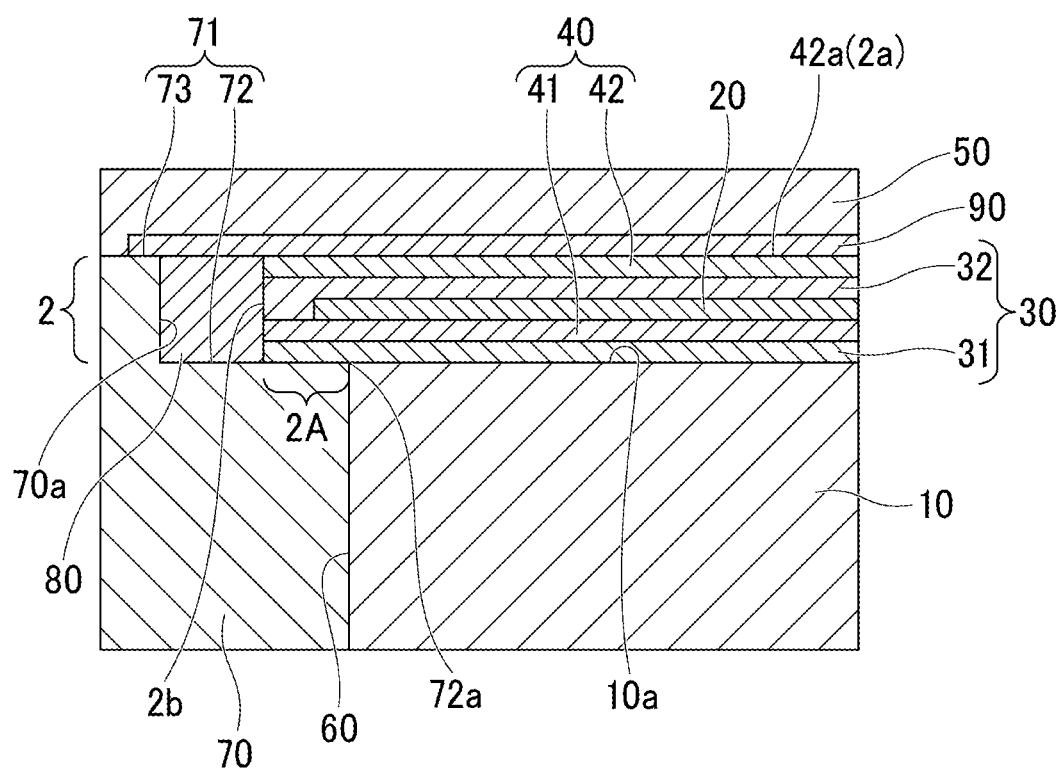
FIG. 4 is a diagram illustrating the basic structure of an electrostatic chuck device of Example 2, and represents an enlargement of the region corresponding with the region a shown in FIG. 1.

In Example 1 described above, with the exception of disposing the edge portion 2A of the stack 2 on the first upper surface 72 of the sleeve 70 so that the length in the horizontal direction of the edge portion 2A on the first upper surface 72, based on the outside edge 72a of the first upper surface 72, was 30% of the length from the outside surface 70a between the first upper surface 72 and the second upper surface 73 to the outside edge 72a of the first upper surface 72, an electrostatic chuck device of Example 2 illustrated in FIG. 4 was obtained in the same manner as that described for Example 1.

For the thus obtained electrostatic chuck device, the presence or absence of cracking in the ceramic layer 50 was confirmed in the same manner as Example 1. The result is shown in Table 1.

Comparative Example 1

Figure 5:
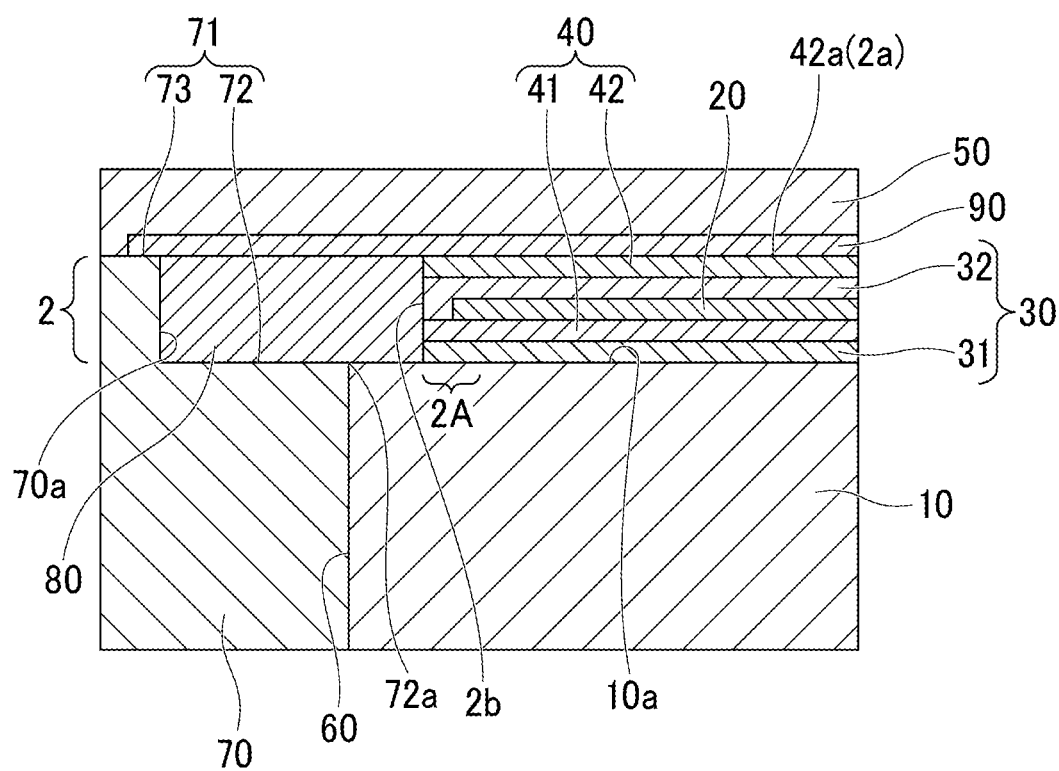
FIG. 5 is a diagram illustrating the basic structure of an electrostatic chuck device of Comparative Example 1, and represents an enlargement of the region corresponding with the region a shown in FIG. 1.

In Example 1 described above, with the exception of not disposing the edge portion 2A of the stack 2 on the first upper surface 72 of the sleeve 70, an electrostatic chuck device of Comparative Example 1 illustrated in FIG. 5 was obtained in the same manner as that described for Example 1.

For the thus obtained electrostatic chuck device, the presence or absence of cracking in the ceramic layer 50 was confirmed in the same manner as Example 1. The result is shown in Table 1.

Comparative Example 2

Figure 7:
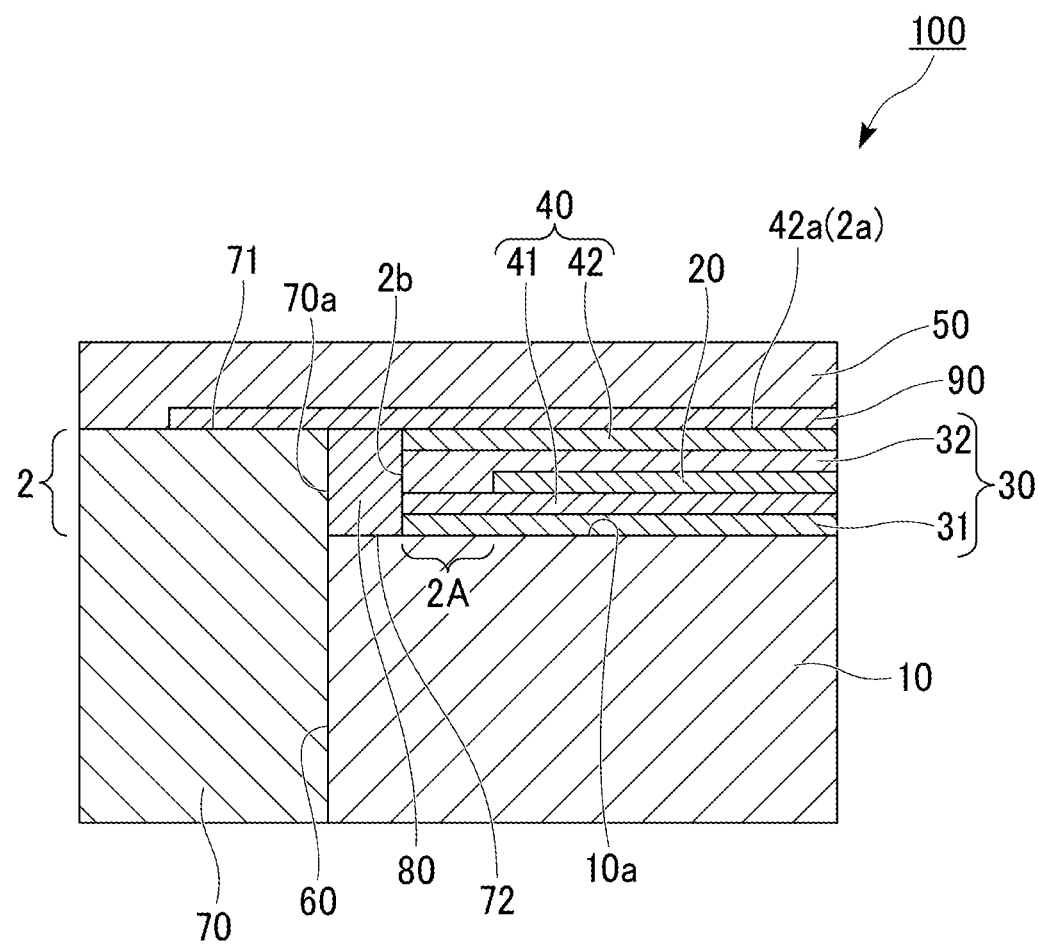
FIG. 7 is a diagram illustrating the basic structure of an electrostatic chuck device of Comparative Example 2, and represents an enlargement of the region corresponding with the region a shown in FIG. 1.

In Example 1 described above, with the exceptions of not forming the upper surface 71 of the sleeve 70 as a two-level structure, and not disposing the edge portion 2A of the stack 2 on the first upper surface 72 of the sleeve 70, an electrostatic chuck device 100 of Comparative Example 2 illustrated in FIG. 7 was obtained in the same manner as that described for Example 1.

For the thus obtained electrostatic chuck device, the presence or absence of cracking in the ceramic layer 50 was confirmed in the same manner as Example 1. The result is shown in Table 1.

TABLE 1

|  | Example 1 | Example 2 | Comparative Example 1 | Comparative Example 2 |
|---|---|---|---|---|
| Presence or absence of cracking in ceramic layer | o | o | x | x |

Based on the results in Table 1, it was confirmed that by forming the upper surface 71 of the sleeve 70 as a two-level structure having the first upper surface 72 and the second upper surface 73, and disposing the edge portion 2A of the stack 2 on the first upper surface 72, the occurrence of cracking in the ceramic layer 50 could be suppressed.

INDUSTRIAL APPLICABILITY

In the electrostatic chuck device of the present invention, a through-hole such as a gas supply hole (lift pin hole) is provided that penetrates through the substrate and the stack in the thickness direction, a sleeve is inserted in the through-hole, the upper surface of the sleeve in the thickness direction has a two-level structure having a first upper surface positioned on the same plane as the upper surface of the substrate in the thickness direction, and a second upper surface positioned above the first upper surface in the thickness direction of the sleeve and disposed proximate to the ceramic layer, and in a plan view, the edge portion of the stack is disposed on top of the first upper surface. As a result, the stress produced when the heat that is generated during formation of the ceramic layer causes thermal expansion of the filler used to fill the space between the end surface of the stack and the outside surface of the sleeve can be dispersed, and cracking of the ceramic layer due to that stress can be suppressed.

DESCRIPTION OF THE REFERENCE SIGNS

1 Electrostatic chuck device
2 Stack
10 Substrate
20 Internal electrode
30 Adhesive layer
31 First adhesive layer
32 Second adhesive layer
40 Insulating organic film
41 First insulating organic film
42 Second insulating organic film
50 Ceramic layer
51 Ceramic base layer
52 Ceramic surface layer
60 Through-hole
70 Sleeve
71 Upper surface
72 First upper surface
73 Second upper surface 75 Through-hole
80 Filler
90 Intermediate layer

The invention claimed is:

1. An electrostatic chuck device comprising:
a substrate,
a stack containing at least an internal electrode stacked on top of the substrate,
a ceramic layer stacked on an upper surface of the stack in a thickness direction,
a through-hole penetrating through the substrate and the stack in the thickness direction,
a sleeve formed from an insulating material and inserted in the through-hole, an upper surface of the sleeve in the thickness direction including a two-level structure having a first upper surface positioned coplanar with an upper surface of the substrate in the thickness direction, and a second upper surface positioned above the first upper surface in the thickness direction and disposed proximate to the ceramic layer, an edge portion of the stack in a plan view being disposed on top of the first upper surface,
wherein a space between an outside surface of the edge portion and an outside surface between the first upper surface and the second upper surface is either (i) filled with a filler or (ii) left as a void.

2. The electrostatic chuck device according to claim 1, wherein the ceramic layer has a base layer, and a surface layer having unevenness formed on an upper surface of the base layer in a thickness direction.

3. The electrostatic chuck device according to claim 1, wherein the edge portion defines a length in a horizontal direction between 10% and 90% of a distance from the outside surface between the first upper surface and the second upper surface to an outside edge of the first upper surface.

4. The electrostatic chuck device according to claim 1, wherein the edge portion defines a length in a horizontal direction between 35% and 75% of a distance from the outside surface between the first upper surface and the second upper surface to an outside edge of the first upper surface.

* * * * *